(12) United States Patent
Forrest et al.

(10) Patent No.: US 9,461,193 B2
(45) Date of Patent: Oct. 4, 2016

(54) FOCUSING LUMINESCENT AND THERMAL RADIATION CONCENTRATORS

(75) Inventors: Stephen R. Forrest, Ann Arbor, MI (US); Noel C. Giebink, State College, PA (US)

(73) Assignee: The Regents of the University of Michigan, Ann Arbor, MI (US)

( * ) Notice: Subject to any disclaimer, the term of this patent is extended or adjusted under 35 U.S.C. 154(b) by 450 days.

(21) Appl. No.: 13/470,938

(22) Filed: May 14, 2012

(65) Prior Publication Data
US 2012/0285531 A1   Nov. 15, 2012

Related U.S. Application Data

(60) Provisional application No. 61/485,896, filed on May 13, 2011.

(51) Int. Cl.
*H01L 31/055* (2014.01)
*H01L 31/054* (2014.01)
(Continued)

(52) U.S. Cl.
CPC ............ *H01L 31/055* (2013.01); *G01J 1/0422* (2013.01); *G01J 1/0448* (2013.01); *G01J 1/0488* (2013.01); *G01J 1/4204* (2013.01); *G01J 1/429* (2013.01); *H01L 31/0543* (2014.12); *H01L 31/0549* (2014.12); *Y02E 10/52* (2013.01)

(58) Field of Classification Search
CPC ............ H01M 6/30; H01L 31/02013; H01L 31/0516; Y02E 10/50; H03L 31/02013; H03L 31/055; H03L 31/0543; H03L 31/0549; G01J 1/0422; G01J 1/0448; G01J 1/0488; G01J 1/04204; G01J 1/429

USPC ........ 136/205, 206, 214, 246, 247, 257, 259
See application file for complete search history.

(56) References Cited

U.S. PATENT DOCUMENTS 7,314,673 B2 * 1/2008 Cheung et al. ............... 428/701
7,790,406 B2 * 9/2010 Cunningham et al. ........ 435/7.2
(Continued)

FOREIGN PATENT DOCUMENTS

WO   WO 2006-088369   8/2006
WO   WO 2008-157621   12/2008
(Continued)

OTHER PUBLICATIONS

International Search Report from corresponding PCT Application No. PCT/US2012/037777 dated Feb. 25, 2013.

*Primary Examiner* — Susan D Leong
(74) *Attorney, Agent, or Firm* — Finnegan, Henderson, Farabow, Garrett & Dunner LLP (57) ABSTRACT

The present disclosure relates to focusing luminescent concentrators wherein directional emission, obtained by placing an absorber/emitter within a microcavity or photonic crystal, may be oriented by a macroscopic concentrator and focused to a point or line for 3D or 2D concentration, respectively. The focusing luminescent concentrators disclosed herein may provide high concentration ratios without the need for tracking, and may reduce re-absorption losses associated with conventional concentrators. The present disclosure further relates to photovoltaic cells and/or optical detector devices comprising a focusing luminescent concentrator. The devices and methods presently disclosed are also useful, for example, in solar, thermal and thermophotovolatic applications.

16 Claims, 6 Drawing Sheets

(51) Int. Cl.
*G01J 1/04* (2006.01)
*G01J 1/42* (2006.01)

(56) References Cited

U.S. PATENT DOCUMENTS

2007/0146910 A1 6/2007 Duston
2009/0027872 A1* 1/2009 Debije et al. .............. 362/84
2009/0294692 A1* 12/2009 Bourke et al. ............. 250/459.1
2010/0195916 A1* 8/2010 Blondiaux ........... G06K 19/086
                                                          382/209

FOREIGN PATENT DOCUMENTS

WO    WO 2010-012832    2/2010
WO    WO 2010-076791    7/2010
WO    WO 2010-096721    8/2010

* cited by examiner

FOCUSING LUMINESCENT AND THERMAL RADIATION CONCENTRATORS

This application claims the benefit of priority to U.S. Provisional Application No. 61/485,896, filed on May 13, 2011, which is incorporated herein by reference in its entirety.

This invention was made with U.S. Government support under FA 9550-07-10364 awarded by the U.S. Air Force Office of Scientific Research. The government has certain rights in the invention.

The claimed invention was made by, on behalf of, and/or in connection with one or more of the following parties to a joint university-corporation research agreement: University of Michigan and Global Photonic Energy Corporation. The agreement was in effect on and before the date the invention was made, and the claimed invention was made as a result of activities undertaken within the scope of the agreement.

The present disclosure generally relates to focusing luminescent concentrators. The present disclosure further relates to focusing luminescent concentrators comprising a microcavity comprising a photosensitive material that may absorb and emit energy in a directional manner. Methods of generating electricity by focusing energy onto a photosensitive element with a focusing luminescent concentrator are also disclosed. The focusing luminescent concentrators presently disclosed are useful, for example, in photovoltaic and thermophotovoltaic applications and devices.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m2, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{sc}$, in Amperes (2) the photovoltage under open circuit conditions, i.e., the open circuit voltage $V_{OC}$, in Volts and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff=\{I_{max}V_{max}\}/\{I_{SC}V_{OC}\} \quad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\gamma_P$, may be calculated by:

$$\gamma_P = ff^*(I_{SC}*V_{OC})/P_{inc}$$

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0+h\nu\Psi S_0^*$. Here $S_0$ and $S_0^*$ denote ground and excited molecular states, respectively. This energy absorption is associated with the promotion of an electron from a bound state in the HOMO energy level, which may be a B-bond, to the LUMO energy level, which may be a B*-bond, or equivalently, the promotion of a hole from the LUMO energy level to the HOMO energy level. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair becomes separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) energy level and the lowest unoccupied molecular orbital (LUMO) energy level, called the HOMO-LUMO gap. The Fermi energy characterizes the statistical occupation of molecular quantum energy states denoted by the value of energy for which the probability of occupation is equal to ½. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. Preferably, but not necessarily, an acceptor material is an ETL and a donor material is a HTL.

Conventional inorganic semiconductor PV cells employ a p-n junction to establish an internal field. Early organic thin film cell, such as reported by Tang, *Appl. Phys Lett.* 48, 183

(1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process. That is, carrier generation requires exciton generation, diffusion and ionization or collection. There is an efficiency γ associated with each of these processes. Subscripts may be used as follows: P for power efficiency, EXT for external quantum efficiency, A for photon absorption, ED for diffusion, CC for collection, and INT for internal quantum efficiency. Using this notation:

$$\gamma_P \sim \gamma_{EXT} = \gamma_A * \gamma_{ED} * \gamma_{CC}$$

$$\gamma_{EXT} = \gamma_A * \gamma_{INT}$$

The diffusion length ($L_D$) of an exciton is typically much less ($L_D$~50Å) than the optical absorption length (~500Å), requiring a trade-off between using a thick, and therefore resistive, cell with multiple or highly folded interfaces, or a thin cell with a low optical absorption efficiency.

Different approaches to increase efficiency have been taken, including use of doped organic single crystals, conjugated polymer blends, and use of materials with increased exciton diffusion length. The power conversion efficiencies of organic PV cells have steadily increased since the introduction of the donor/acceptor (DA) heterojunction. Further improvements have been reported in entangled or "bulk-heterojunction" structures, where the DA interface is within an exciton diffusion length (~10 nm) of the site for photon absorption. However, the high series resistance of these amorphous blends limits the active layer thickness, potentially leading to low fill factor and reduced light absorption, and hence a low solar energy conversion efficiency.

The efficiency of photovoltaic devices may be increased by the use of optical concentrators. Optical concentrators typically use reflective mirrors, reflective lenses, and/or refractive lenses to concentrate optical energy onto a PV cell. Because optical materials are typically less expensive than materials used in PV cells, the use of concentrators may reduce overall production and maintenance costs, and may also allow for the use of smaller amounts of PV cell materials that are particularly efficient yet expensive.

Concentration ratio (CR) is the ratio of area of the concentrating lens or mirror to the area of the PV cell exposed to incident radiation: $CR=A_{Conc}/A_{PV}$. Concentration is typically limited by the quality of the optics and the ability of the concentrator to focus sunlight onto the PV cell surface. Diffuse, or scattered, sunlight is generally less useful than direct sunlight because diffuse radiation reaches the concentrator at wide angles that cannot be coupled to the cell. The concentrator should be pointed at the sun to achieve maximum concentration of direct light on the PV cell. Conventional optical concentrators have several disadvantages. For example, to achieve high solar concentration ratios (CR>10), optical concentrators often require expensive tracking systems to maintain normal incidence with the sun. In addition, the lenses and/or mirrors used to concentrate light also generate heat, and often require cooling to maintain efficiency of the PV device. Cooling requirements may impose additional production and maintenance costs, as well as undesirable complexity and/or logistical challenges.

Figure 1:
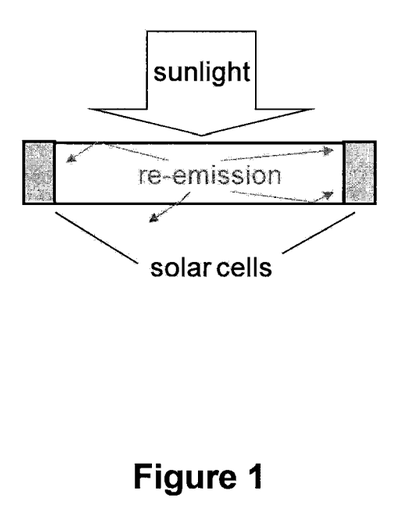
FIG. 1 is a schematic of a conventional luminescent concentrator.

Non-tracking concentrators have been developed, including luminescent concentrators (LSCs), which absorb and directionally re-emit energy by the use of waveguides. Currie et al. (*Science*, 2008, vol. 321, pp. 226-228) discloses organic solar concentrator devices comprising organic dyes deposited on high-refractive-index glass substrates connected to solar cells. However, the efficiency of LSCs is limited by re-absorption and scattering losses in the waveguide layer, which may give low concentration ratios (CR<10). An example of a conventional LSC is shown in FIG. 1.

There remains a need in the art for non-tracking optical concentrators that achieve high CRs at relatively low cost and without the need for cooling. To solve this and other problems mentioned above, the Inventors have discovered that it is possible to make the re-emitted energy highly directional, such as through the use of a surrounding microcavity, grating or photonic crystal and to focus the highly directional energy with a focusing luminescent concentrator (FLSC).

Thus, there is disclosed a focusing luminescent concentrator (FLSC) for focusing energy. In one embodiment, the FLSC comprising a microcavity comprises: a top semi-transparent mirror; a bottom semi-transparent mirror; and a photosensitive material between the top and bottom semi-transparent mirrors, wherein the photosensitive material absorbs and re-emits energy in a directional manner from the microcavity, such as where the re-emitted energy is focused onto at least one photosensitive element.

In one embodiment, the microcavity comprises a shape having at least one focal point, such as a cylindrical/spherical or elliptical shape, and the emitted energy is focused onto at least one photosensitive element located at a least one focal point within the shape.

In another embodiment, the microcavity is flat and the FLSC further comprises a Fresnel lens located between the microcavity and the at least one photosensitive element to focus the emitted energy onto the at least one photosensitive element. The FLSC may be non-tracking.

It is understood that the photosensitive material is capable of down-converting the absorbed energy such that the re-emitted energy is lower than the absorbed energy.

In one embodiment, the photosensitive material comprises a fluorescent dye or a mixture of fluorescent dyes.

In one embodiment, the top semi-transparent mirror and bottom semi-transparent mirrors comprise distributed Bragg reflectors (DBR). It is understood that the top DBR, bottom DBR, or both can be tuned, independently of each another, to absorb and emit a particular energy wavelength or range of wavelengths.

The photosensitive material of the microcavity may be comprised of various materials, such as photonic crystals or metal nanoparticles.

There is also disclosed a method of generating electricity by focusing optical energy onto at least one photosensitive element with a focusing luminescent concentrator (FLSC) as described herein.

In one embodiment, the method comprising:
exposing the FLSC to optical energy such that energy enters the microcavity through the top semi-transparent mirror for absorption by the photosensitive material;
emitting energy through the bottom semi-transparent mirror; and
focusing the emitted energy onto at least one photosensitive element.

Aside from the subject matter discussed above, the present disclosure includes a number of other exemplary features such as those explained hereinafter. It is to be understood that both the foregoing description and the following description are exemplary only.

The accompanying figures are incorporated in, and constitute a part of this specification.

The present disclosure relates to a focusing luminescent concentrator (FLSC). The FLSCs presently disclosed may be useful in a variety of photovoltaic and thermophotovoltaic devices and applications, such as photovoltaic (PV) cells, solar cells, photovoltaic detectors, thermophotovoltaic cells, and production/generation of electricity and/or heat.

Embodiments of the FLSC presently disclosed may comprise a microcavity that may modify, or directionalize, the emission pattern of incident radiation.

In some embodiments, the microcavity comprises a top semi-transparent mirror, a bottom semi-transparent mirror, and at least one photosensitive material located between the top and bottom semi-transparent mirrors. As used herein, the term "semi-transparent" means at least partially transparent to light. The semi-transparent mirrors in accordance with the present disclosure may range from having very weak to very strong reflectivity, where reflectivity (R) is defined as the ratio of incident light to reflected light: $R=(R_i/R_{ref})$. A strongly reflective mirror has a reflectivity value close to 1.

The semi-transparent mirrors may comprise at least one dielectric material, such as silicon oxide ($SiO_x$, glass), titanium oxide ($TiO_x$), silicon nitride ($SiN_x$), $TeO_2$, LiF, other inorganic dielectric materials, polymers, evaporated small molecules, and combinations thereof.

Figure 2A:
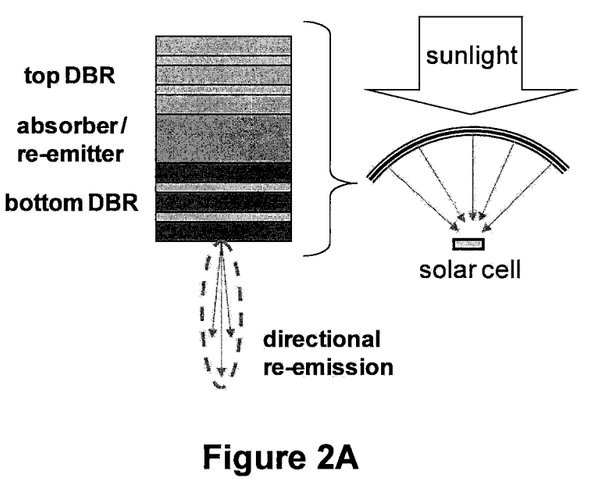
FIG. 2 is a schematic of a focusing luminescent concentrator comprising Distributed Bragg Reflectors (DBR).
Figure 2B:
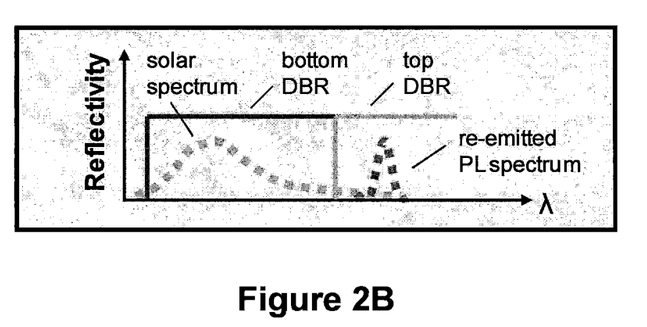
Figure 3:
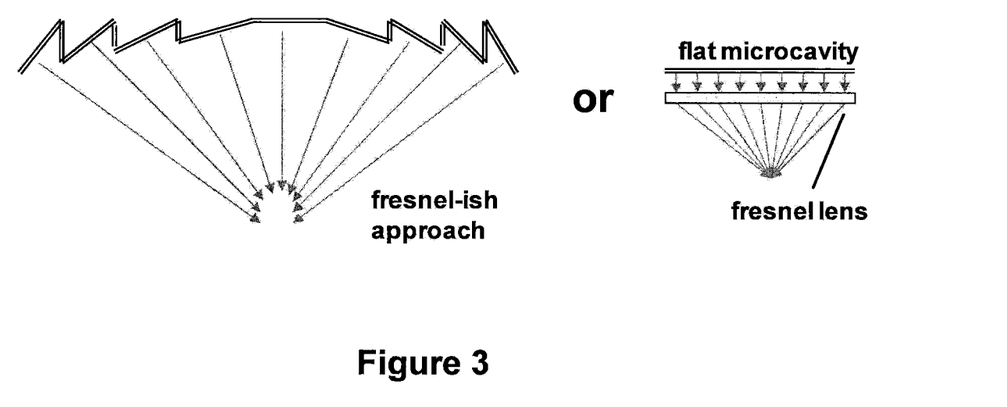
FIG. 3 is a schematic of a flat focusing luminescent concentrator with Fresnel lens.

In some embodiments of the present disclosure, at least one of the semi-transparent mirrors comprise distributed Bragg reflectors (DBR). DBRs are optical structures that may comprise an alternating sequence of layers of different optical materials. Constructive or destructive interference of radiation at the interfaces between those materials contributes to the DBR's characteristic reflectivity. FIG. 2 shows an example of the DBRs according to the present disclosure. These non-limiting examples of DBRs may be tuned to absorb and/or emit a particular wavelength or range of wavelengths of light, such as wavelengths in the ultraviolet, visible, and/or infrared regions of the electromagnetic spectrum.

In some embodiments of the present disclosure, the top and bottom DBRs may be tuned, independently from each another, to absorb and/or emit wavelengths of light ranging from 350 nm to 1.50 μm, such as from 400 nm to 1.30 μm, 400 nm to 1.25 μm, 400 nm to 1.20 μm, 410 nm to 1.30 μm, 410 nm to 1.25 μm, or 410 nm to 1.20 μm. In at least one embodiment, the top DBR may be tuned to absorb a wavelength ranging from 400 nm to 1.20 μm and to emit a wavelength ranging from 410 nm to 1.30 μm. In at least one embodiment, the bottom DBR may be tuned to absorb a wavelength ranging from 400 nm to 1.20 μm and to emit a wavelength ranging from 410 nm to 1.30 μm. In certain embodiments, the top DBR and bottom DBR are both tuned to absorb a wavelength ranging from 400 nm to 1.20 μm and to emit a wavelength ranging from 410 nm to 1.30 μm. It should be noted that one of ordinary skill in the art would contemplate additional ranges in accordance with the present disclosure.

In some embodiments, the photosensitive material may absorb incident radiation and down-convert the absorbed radiation to lower energy for directionalized emission from the microcavity. As used herein "down-converting," or any version thereof, refers to the ability to convert electromagnetic energy to a lower energy or longer wavelength.

In other embodiments, the photosensitive material may absorb incident radiation and up-convert the absorbed radiation to higher energy for directionalized emission from the microcavity. As used herein "up-converting," or any version thereof, refers to the ability to convert electromagnetic energy to a higher energy or shorter wavelength. For example, the photosensitive material may convert wavelengths of light outside of visible (e.g., λ>700 nm) to within the visible range (about 400 nm≤λ≤700 nm). Up-conversion may occur, for example, via a combination of photon energies.

In some embodiments of the present disclosure, the microcavity comprises a photonic crystal. The photonic crystal may comprise, for example, a dielectric material, wherein the lattice constant of the crystal is on the order of an optical wavelength. Photonic crystals are generally characterized by a photonic band gap (PBG) that allows for the transmission of a specific wavelength or range of wavelengths while excluding the transmission of other wavelengths or range of wavelengths.

Photonic crystals in accordance with the present disclosure may have one-dimensional (1-D), two-dimensional (2-D), and/or three-dimensional (3-D) structural forms, and may be natural and/or man-made. In some embodiments, the photonic crystals comprise a dielectric material, such as silicon oxide ($SiO_x$, glass), titanium oxide ($TiO_x$), silicon nitride ($SiN_x$), other inorganic dielectric materials, polymers, and combinations thereof.

The photonic crystal may further comprise at least one photosensitive material doped in the lattice of the photonic crystal.

In other embodiments, the microcavity comprises a top DBR, a bottom DBR, and at least one photosensitive material located between the top and bottom DBRs, wherein at least one of the DBRs comprises a photonic crystal.

The photosensitive material according to the present disclosure may have fluorescent and/or phosphorescent properties. In some embodiments, the photosensitive material comprises at least one organic compound, such as cyanine dyes, porphyrins, porphines, rhodamine, bipyridyl, perylenes, squarines. In at least one embodiment, the photosensitive material comprises an organic dye, such as a fluorescent organic dye molecule. In another embodiment, the photosensitive material comprises a mixture of organic dyes, such as a mixture of organic dyes comprising at least one fluorescent organic dye. Non-limiting examples include 4-(dicyanomethylene)-2-t-butyl-6-(1,1,7,7-tetramethyljuloidyl-9-enyl)-4H-pyran (DCJTB), platinum tetraphenyltetrabenzoporphyrin (Pt(TPBP)), 2,3,7,8,12,13,17,18-octaethyl-21H,23H-porphine platinum(II) (PtOEP), 2-methyl-6-[2-(2,3,6,7-tetrahydro-1H,5H-benzo[ij]quinolizin-9-yl)ethenyl]-4H-pyran-4-ylidene] propane-dinitrile (DCM2). One of ordinary skill in the art would recognize that other fluorescent and/or phosphorescent compounds may also be suitable for the focusing luminescent concentrators presently disclosed.

In some embodiments, the photosensitive material comprises at least one inorganic compound, such as colloidal quantum dots, (PbS, PbSe, CdSe, Si). Photosensitive materials comprising mixtures of organic and inorganic compounds are also contemplated such as rare earth metal ions doped in an inorganic matrix.

The microcavity of the focusing luminescent concentrator presently disclosed may be flat, for example, or may form a macroscopic curvature. In at least one embodiment, the microcavity comprises a shape having at least 1 focal point, such as a cylindrical/spherical shape. See, e.g., FIG. 4. In at least one embodiment, the microcavity comprises a shape having at least 2 focal points, such as an elliptical shape. See, e.g., FIG. 5. Certain embodiments of the present disclosure may comprise an array of microcavities that are flat or form a macroscopic curvature. Combinations of microcavities are also contemplated.

The focusing luminescent concentrator may further comprise at least one Fresnel lens. For example, the Fresnel lens may be located between the microcavity and at least one photosensitive element to focus energy emitted from the microcavity onto the at least one photosensitive element. The Fresnel lens may comprise hard and/or flexible materials, such as various types of plastic materials.

The microcavity may comprise metal nanoparticles in two or three dimensions, with the photosensitive material doped between the nanoparticles. These structures act similar to a photonic crystal, modifying the radiative decay pathways of the emitter and creating directional emission. In one embodiment, the photosensitive material may be dispersed in a polymer matrix such as polyvinyl butyral (PVB) or polymethylmethacrylate (PMMA). The nanoparticles may comprise a single metal or an alloy of metals. Suitable, non-limiting examples of metal nanoparticles include noble metals such as gold (Au), silver (Ag), platinum (Pt), and palladium (Pd) and alloys thereof. In one embodiment, the nanoparticles may be in an ordered arrangement, such as an array of rows or columns.

In one embodiment, the microcavity may comprise a grating. The grating may be patterned in one or two dimensions and may feature multiple periodicities. In particular, quasi-crystal patterns may be used to increase the azimuthal symmetry of the grating in Fourier space.

In another embodiment, the focusing luminescent concentrator comprises an evanescently coupled bilayer comprising a low refractive index layer and an emissive layer. The emissive layer according to the present disclosure may have fluorescent and/or phosphorescent properties. In some embodiments, the emissive layer comprises at least one organic compound, such as cyanine dyes, porphyrins, porphines, rhodamine, bipyridyl, perylenes, squarines. In one embodiment, the emissive layer comprises an organic dye, such as a fluorescent organic dye molecule. In another embodiment, the photosensitive material comprises a mixture of organic dyes, such as a mixture of organic dyes comprising at least one fluorescent organic dye. Non-limiting examples of organic dyes include 4-(dicyanomethylene)-2-t-butyl-6-(1,1,7,7-tetramethyljuloidyl-9-enyl)-4H-pyran (DCJTB), platinum tetraphenyltetrabenzoporphyrin (Pt(TPBP)), 2,3,7,8,12,13,17,18-octaethyl-21H,23H-porphine platinum(II) (PtOEP), 2-methyl-6-[2-(2,3,6,7-tetrahydro-1H,5H-benzo[ij]quinolizin-9-yl)ethenyl]-4H-pyran-4-ylidene] propane-dinitrile (DCM2). In at least one embodiment, the emissive layer comprises a polymer such as poly(9,9-di-n-octylfluorene-alt-benzothiadiazole) (F8BT). Low refractive index layers may be formed by, for example, using the sacrificial porogen method described in Giebink et al. (*Applied Physics Letters*, 2011, vol. 98, iss. 8, art. 081103).

Another approach to create directional emission is to use dye-doped microspheres, with dimensions ranging between 1 and 100 microns. Light emitted into whispering gallery modes can be extracted to generate highly directional emission.

The focusing luminescent concentrator may be useful in generating electricity by focusing optical energy onto at least one photosensitive element. The photosensitive element may comprise, for example, a photovoltaic cell, such as a solar cell, such as an organic solar cell. Photovoltaic cells in accordance with the present disclosure include, for example, in U.S. Pat. No. 6,451,415 ("Organic Photosensitive Optoelectronic Device with an Exciton Blocking Layer"), U.S. Pat. No. 6,657,378 ("Organic Photovoltaic Devices"), U.S. Pat. No. 7,179,543 ("Doping of Organic Opto-Electronic Devices to Extend Reliability"), all of which are incorporated by reference herein.

In some embodiments, at least one photosensitive element is located at the at least one focal point of the microcavity comprising the focusing luminescent concentrator. In some embodiments, multiple photosensitive elements are located at the at least one focal point, such as an array of photosensitive elements. In some embodiments, for example, the microcavity comprises a spherical/cylindrical shape having one focal point, and at least one photosensitive element is located at the at least one focal point. In other embodiments, the microcavity comprises an elliptical shape having two focal points, wherein at least one photosensitive element is located at one or both of the two focal points.

The at least one photosensitive element may be attached to at least one photodetector, such as a resonant photodetector or array of photodetectors. The photodetector may comprise, for example, an organic photodetector.

The focusing luminescent concentrator presently disclosed may also be useful in thermal applications. For example, blackbody emission directionalized by the microcavity or photonic crystal may be focused for use in solar, thermal or thermophotovoltaic applications.

There is also disclosed a method of generating electricity by focusing optical energy onto at least one photosensitive element with a focusing luminescent concentrator (FLSC), described herein.

In one embodiment, the method comprises:

exposing the FLSC to optical energy such that energy enters the microcavity through the top semi-transparent mirror for absorption by the photosensitive material;

emitting energy through the bottom semi-transparent mirror; and focusing the emitted energy onto at least one photosensitive element.

In another embodiment, the method described herein comprises down-converting the absorbed energy with the photosensitive material such that the re-emitted energy is lower than the absorbed energy.

The method of generating electricity described herein uses an FLSC having a cylindrical/spherical shape with one focal point, and the at least one photosensitive element is located at the focal point. In another embodiment, the FLSC microcavity has an elliptical shape having two focal points, and at least one photosensitive element is located at each focal point.

In another embodiment, the method described herein may comprise attaching at least one resonant photodetector to the at least one photosensitive element. The method disclosed herein may further comprise at least two resonant photodetectors that are stacked in series and attached to the at least one photosensitive element.

As stated, the emitted energy may be thermal energy or solar energy, and the photosensitive element may comprise a solar cell.

EXAMPLES

The present disclosure may be understood more readily by reference to the following detailed description of exemplary embodiments and the working examples. It is understood that other embodiments will become apparent to those skilled in the art in view of the description and examples disclosed in this specification.

Example 1

Figure 4:
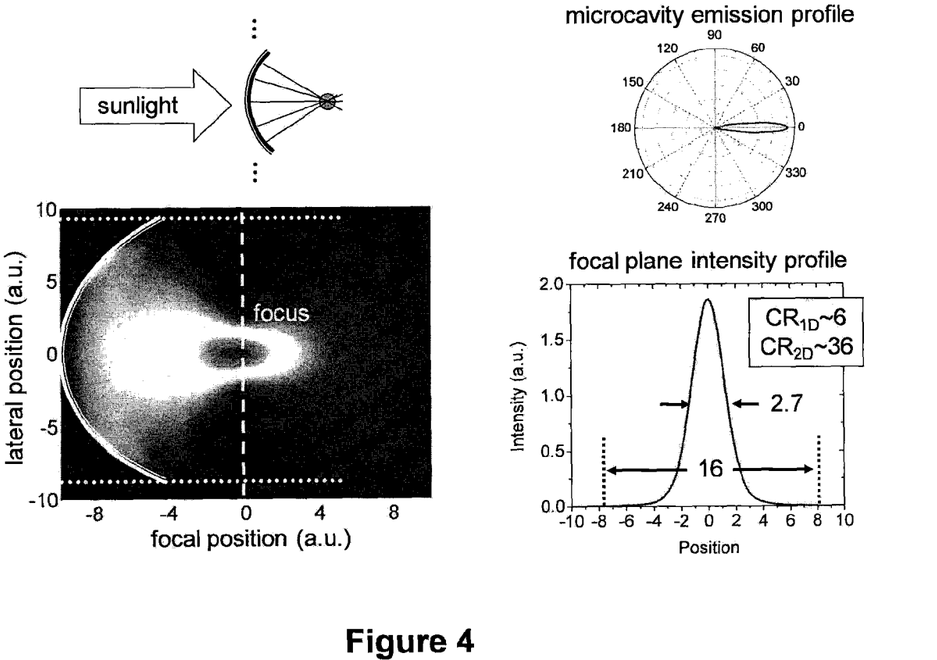
FIG. 4 is a schematic of a cylindrical/spherical focusing luminescent concentrator. The microcavity emission profile and focal plane intensity profile simulated for a cylindrical/spherical focusing luminescent concentrator are also shown.

The microcavity emission profile simulated for a cylindrical/spherical focusing luminescent concentrator is shown in FIG. 4. The simulation was performed by using the microcavity emission profile depicted in the inset, which was generated using the transfer matrices and the method of source terms described in H. Benisty, J. Opt. Soc. Am. A, 15, 1192 (1998). The emission profile was then propagated forward and the intensity at each point in space was calculated. As shown in FIG. 4, the 1-D and 2-D concentration ratios were $CR_{1D}$~6 and $CR_{2D}$~36.

Example 2

Figure 5:
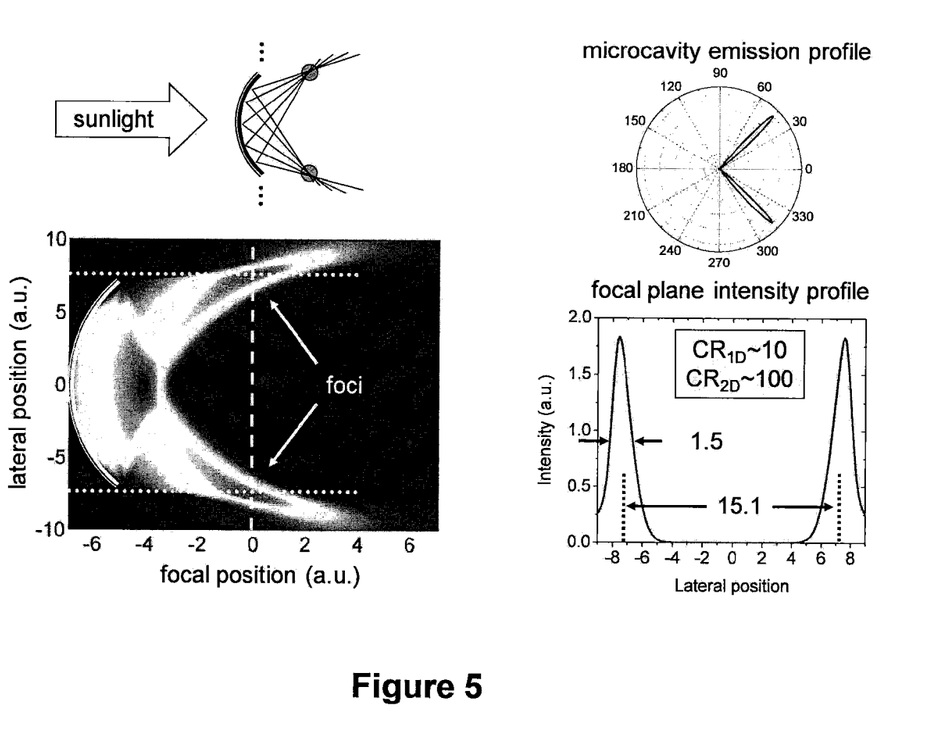
FIG. 5 is a schematic of an elliptical focusing luminescent concentrator. The microcavity emission profile and focal plane intensity profile simulated for a cylindrical/spherical focusing luminescent concentrator are also shown.

The microcavity emission profile simulated for an elliptical focusing luminescent concentrator appears in FIG. 5. The simulation was performed as described in Example 1. The 1-D and 2-D concentration ratios were $CR_{1D}$~10 and $CR_{2D}$~100.

Example 3

Figure 6:
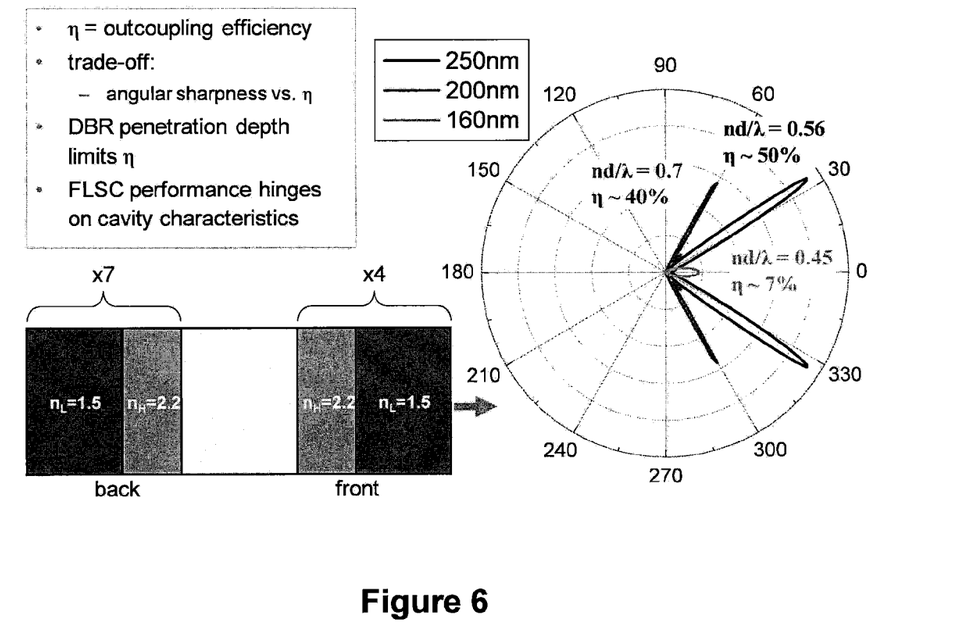
FIG. 6 is a schematic of a flat focusing luminescent concentrator with Fresnel lens. The microcavity emission profile simulated for a cylindrical/spherical focusing luminescent concentrator is also shown.

FIG. 6 shows a microcavity simulation according to the present invention. It shows an emissive layer sandwiched by two planar distributed Bragg reflector mirrors that consist of quarter-wave stacks with low and high refractive indices of n=1.5 ($SiO_2$) and n=2.2 ($TiO_2$), respectively. Alternatively, a bilayer evanescently coupled cavity configuration can also be used to generate highly directional emission.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A focusing luminescent concentrator (FLSC) for focusing energy, said FLSC comprising a microcavity comprising:

a top semi-transparent mirror;

a bottom semi-transparent mirror; and a photosensitive material between the top and bottom semi-transparent mirrors; wherein the photosensitive material re-emits absorbed energy in a directional manner from the microcavity through the bottom semi-transparent mirror.

2. The FLSC according to claim 1, wherein the re-emitted energy is focused onto at least one photosensitive element.

3. The FLSC according to claim 2, wherein the microcavity comprises a shape having at least one focal point, and the re-emitted energy is focused onto the at least one photosensitive element located at the at least one focal point.

4. The FLSC according to claim 3, wherein the microcavity has a cylindrical/spherical or elliptical shape.

5. The FLSC according to claim 2, wherein the microcavity is flat; the FLSC further comprising a Fresnel lens located between the microcavity and the at least one photosensitive element to focus the emitted energy onto the at least one photosensitive element.

6. The FLSC according to claim 1, wherein the photosensitive material is capable of down-converting the absorbed energy such that the re-emitted energy is lower than the absorbed energy.

7. The FLSC according to claim 1, wherein the photosensitive material comprises a fluorescent dye.

8. The FLSC according to claim 1, wherein the photosensitive material comprises a mixture of fluorescent dyes.

9. The FLSC according to claim 1, wherein at least one of the top semi-transparent mirror and bottom semi-transparent mirror comprise distributed Bragg reflectors (DBR).

10. The FLSC according to claim 9, wherein when both the top and bottom semi-transparent mirrors comprise DBRs, either the top DBR, the bottom DBR, or both are tuned, independently of each another, to absorb and emit a particular energy wavelength or range of wavelengths.

11. The FLSC according to claim 10, wherein the top DBR is tuned to absorb a wavelength ranging from 400 nm to 1.2 µm, and to emit a wavelength ranging from 410 nm to 1.3 µm.

12. The FLSC according to claim 10, wherein the bottom DBR is tuned to absorb a wavelength ranging from 400 nm to 1.2 μm, and to emit a wavelength ranging from 410 nm to 1.3 μm.

13. The FLSC according to claim 1, wherein the microcavity comprises a photonic crystal comprising the photosensitive material.

14. The FLSC according to claim 1, wherein the microcavity comprises metal nanoparticles comprising the photosensitive material.

15. The FLSC according to claim 1, wherein the FLSC is non-tracking.

16. The FLSC according to claim 1, wherein the absorbed and re-emitted energy comprises thermal energy.

* * * * *